(12) United States Patent
Kinyua et al.

(10) Patent No.: US 8,766,840 B2
(45) Date of Patent: Jul. 1, 2014

(54) SYSTEM AND METHOD FOR A HIGH RESOLUTION DIGITAL INPUT CLASS D AMPLIFIER WITH FEEDBACK

(71) Applicant: Taiwan Semiconductor Manufacturing Co., Ltd., Hsin-Chu (TW)

(72) Inventors: Martin Kinyua, Cedar Park, TX (US); Eric Soenen, Austin, TX (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/685,185

(22) Filed: Nov. 26, 2012

(65) Prior Publication Data

US 2014/0062745 A1 Mar. 6, 2014

Related U.S. Application Data

(63) Continuation-in-part of application No. 13/597,291, filed on Aug. 29, 2012.

(51) Int. Cl.
*H03M 1/82* (2006.01)
(52) U.S. Cl.
USPC .......................................... 341/152; 341/144
(58) Field of Classification Search
USPC .................................................. 341/143–144
See application file for complete search history.

(56) References Cited

U.S. PATENT DOCUMENTS

| | | | | |
|---|---|---|---|---|
| 5,008,674 A | * | 4/1991 | Da Franca et al. | 341/150 |
| 5,323,157 A | * | 6/1994 | Ledzius et al. | 341/143 |
| 6,177,896 B1 | * | 1/2001 | Min | 341/143 |
| 6,177,897 B1 | * | 1/2001 | Williams, III | 341/150 |
| 6,531,973 B2 | * | 3/2003 | Brooks et al. | 341/143 |
| 6,816,097 B2 | * | 11/2004 | Brooks et al. | 341/143 |
| 6,950,049 B2 | * | 9/2005 | Brooks et al. | 341/143 |
| 7,256,720 B2 | * | 8/2007 | Fukuda | 341/143 |
| 8,189,802 B2 | * | 5/2012 | Miao et al. | 381/73.1 |

OTHER PUBLICATIONS

Ramaswamy, S. et al.,"A High-Performance Digital-Input Class-D Amplifier with Direct Battery Connection in a 90nm Digital CMOS Process", 2008 IEEE International Solid-State Circuits Conference, ISSCC 2008/Session 24/Analog Power Techniques/24.2, 3 pages.
Teplechuck, M. et al., "Filterless Integrated Class-D Audio Amplifier Achieving 0.0012% THD+N And 96dB PSRR When Supplying 1.2W", 2011 IEEE International Solid-State Circuits Conference, ISSCC 2011/Session 13/Analog Techniques/13.3, 3 pages.

\* cited by examiner

*Primary Examiner* — Khai M Nguyen
(74) *Attorney, Agent, or Firm* — Duane Morris LLP

(57) ABSTRACT

A system and method is disclosed for a digital input Class D amplifier which includes an interpolation filter to up-sample a digital signal, a noise shaping modulator to suppress in-band quantization errors due to digital pulse width modulation and truncation errors, and a hybrid finite impulse response filter/digital to analog converter coupled to an analog input Class D amplifier with digital pulse width modulation control loop. The hybrid finite impulse response filter/digital to analog converter uses N-taps implemented digitally and N-tap weights implemented in analog using resistors.

20 Claims, 8 Drawing Sheets

US 8,766,840 B2

SYSTEM AND METHOD FOR A HIGH RESOLUTION DIGITAL INPUT CLASS D AMPLIFIER WITH FEEDBACK

RELATED APPLICATION

The instant application is a continuation-in-part of U.S. application Ser. No. 13/597,291, entitled "System and Method for a High Resolution Digital Input Class D Amplifier with Feedback" filed 29 Aug. 2012, the entirety of which is hereby incorporated herein by reference.

BACKGROUND

Many electrical circuits operate on digital data since there are known advantages to using digital circuit devices. However, some applications require that the output of the digital circuits be converted to the analog domain so that the output can be perceived more easily by humans as well as other entities that are more adapted to receiving and interpreting analog signals than digital signals. Thus, there remains a need to convert digital data into an analog output, for example for audio devices, video devices, and other devices for which an analog signal is advantageous.

The efficient and accurate conversion of digital signals to amplified analog signals, especially at high data rates, continues to be prone to a number of problems, such as performance degradation due to unmatched rise/fall times of the output analog signal, clock jitter limitations, intersymbol interference, and relatively high harmonic distortion, to name a few. Additionally, current digital-to-analog ("DAC") converters sometimes employ multi-bit truncation DACs, which require Dynamic Element Matching schemes to suppress static nonlinearity conversion errors.

Traditionally, a DAC can be implemented in either discrete time or in continuous time, each with its own drawbacks. For example, discrete time implementations having switched capacitors have a dynamic range that is limited by thermal noise, require a large bandwidth for the reconstruction amplifier/low pass filter, and typically requires more area in a circuit due to the need for large charge transfer capacitors. Continuous time implementations generate distortion and in-band noise due to the unmatched rise/fall times and intersymbol interference, are very sensitive to clock jitter, and multi-bit truncation and noise filters can mitigate sensitivity.

Thus, there is a need for an efficient and accurate DAC that can overcome these and other problems with current DACs and drive a Class D amplifier.

DETAILED DESCRIPTION

With reference to the figures where like elements have been given like numerical designations to facilitate an understanding of the present subject matter, various embodiments of a system and method for compensating for timing misalignments are described. In order to more fully understand the present subject matter, a brief description of applicable circuitry will be helpful.

A system and method is disclosed for a digital input Class D amplifier which includes an interpolation filter to up-sample a digital signal, a noise shaping modulator to suppress in-band quantization errors due to digital pulse width modulation and truncation errors, and a hybrid finite impulse response filter/digital to analog converter coupled to an analog input Class D pulse width modulation control loop.

Figure 1:
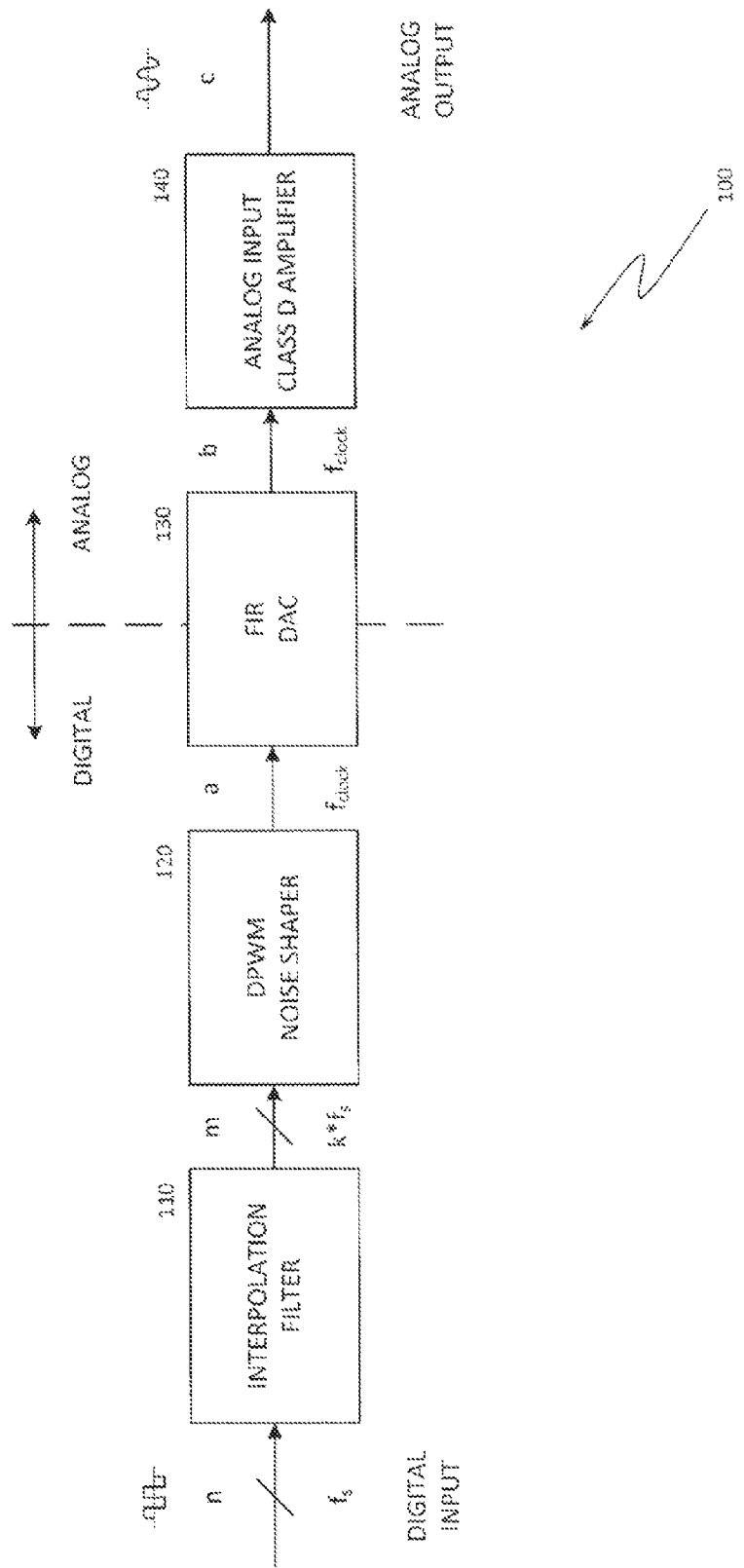
FIG. 1 is an illustration of a high-level functional block diagram of a digital input Class D amplifier circuit according to an embodiment of the present subject matter.

Referring to FIG. 1, a high-level functional block diagram 100 of a digital input Class D amplifier circuit according to an embodiment of the present subject matter is illustrated. An input digital signal "n" is input to the interpolation filter 110. In certain embodiments, the digital signal n is a digital audio signal which may be comprised of any standard number of bits (e.g., 16, 20, or 24 bits) having been formed from an analog signal at a particular sampling known sampling rate "$f_s$", as is known in the art. In certain embodiments, the sampling rate is selected to be 48, 96, or 192 kHz, although the scope of the present subject matter contemplates many other sampling rates as are known in the art. For example, the present subject matter contemplates sampling rates in the range of 16-400 kHz. Furthermore, in certain embodiments the digital signal n is a pulse code modulation ("PCM") digital signal.

The interpolation filter 110 upsamples the digital signal n by a predetermined amount "k" where the upsample factor k is typically, but not limited to, a value in the range of 64-1024. Other ranges are contemplated by the present subject matter, such as the range of 32-2048. Thus, the output digital signal from the interpolation filter is digital signal "m" at a rate of $k*f_s$, as shown. The digital signal m is passed to the Digital Pulse Width Modulation ("DPWM") Noise Shaper 120. The noise shaper 120 filters out most of the conversion noise, e.g., truncation and pulse width modulation ("PWM") quantization errors, out of the band of interest. In certain embodiments, for example when the digital input signal is a digital audio signal, the band of interest is the audio band (nominally 20 Hz to 20 kHz, as is known in the art). The noise shaper 120, as described in more detail with respect to FIGS. 2 and 3, alters the spectral shape of error introduced by, for example, truncation and quantization so that the noise power is lower in the band of interest and higher outside the band of interest. For example, the noise power may be spread into a band defined by $k*f_s$. The noise shaper 120 outputs a 1-bit PWM digital signal a at $f_{clock}$, as shown in FIG. 1.

The digital signal a is input into the Finite Impulse Response ("FIR") digital-to-analog converter ("DAC") block 130, also identified as "FIR DAC". As discussed below in more detail with respect to FIGS. 4 and 5, the FIR DAC 130 converts the 1-bit PWM digital signal a into multi-level low pass analog signal b which, in certain embodiments, is a filtered audio signal. The analog signal b is input into the Class D amplifier 140 which operates on the analog signal b, as discussed below with respect to FIGS. 4 and 5, and outputs the analog output signal c, which is shown in FIG. 1.

Figure 2:
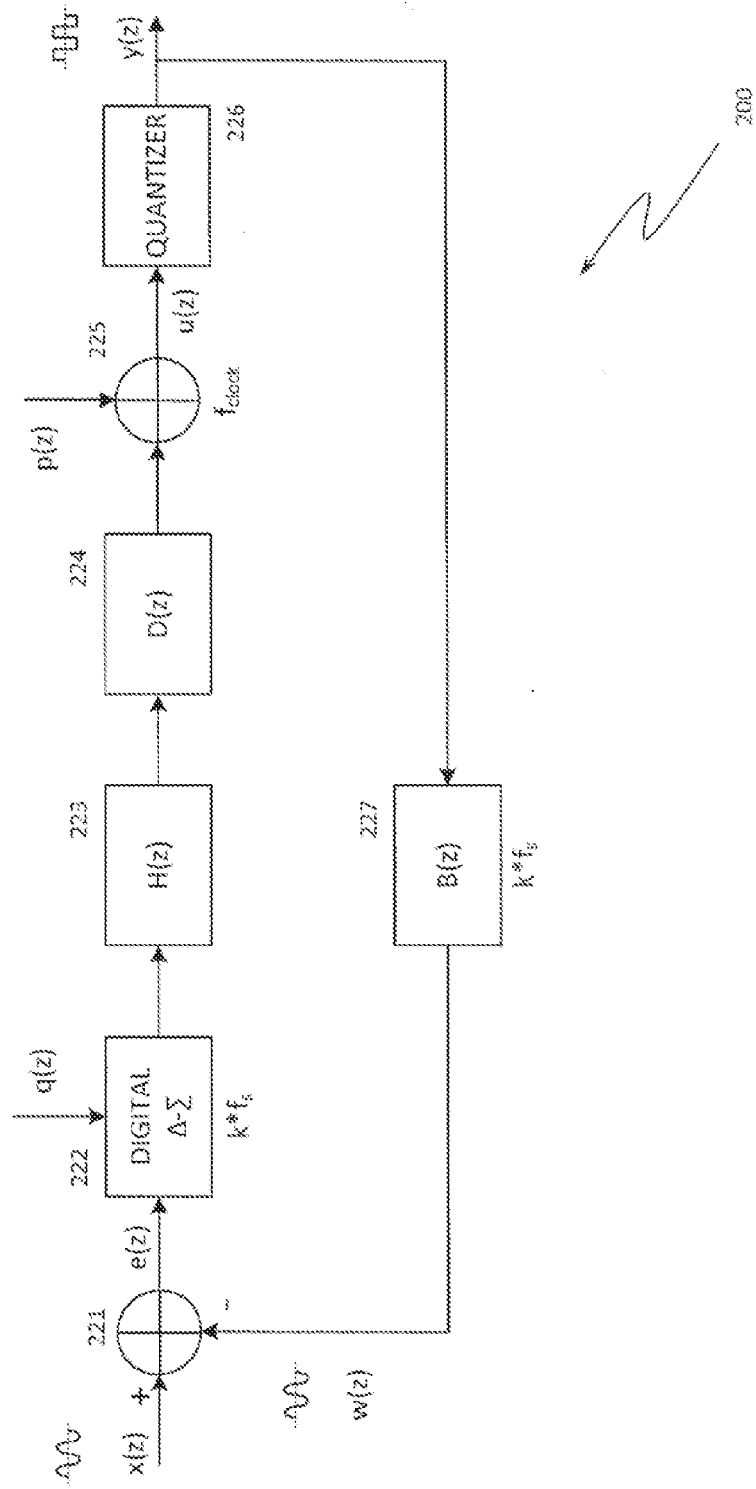
FIG. 2 is an illustration of a functional block diagram of the Digital Pulse Width Modulation ("DPWM") Noise Shaper in FIG. 1, according to an embodiment of the present subject matter.

With attention now directed towards FIG. 2, an illustration of a functional block diagram 200 of the Digital Pulse Width Modulation ("DPWM") Noise Shaper in FIG. 1 is presented, according to an embodiment of the present subject matter. Input signal x(z), which corresponds to signal m in FIG. 1 at rate $k*f_s$, is input to summing junction 221. Input signal x(z) is typically a multilevel digital signal. In certain embodiments, input signal x(z) is a digital PCM signal. Also input into summing junction 221 is feedback signal w(z), which will be discussed below. The output of summing junction 221 is an error signal e(z) which is applied to the digital $\Delta\Sigma$ block 222 which is a noise shaping truncator. Also input to the digital $\Delta\Sigma$ block 222 is digital truncation error signal q(z) which represents the digital truncation error introduced due to rounding/truncating operations of a digital signal as is known in the art. The digital $\Delta\Sigma$ block 222 operates at rate $k*f_s$. The output of digital $\Delta\Sigma$ block 222 is applied to loop filter 223, the output of which is then applied to digital compensation filter 224. The digital compensation filter 224 operates to improve the phase margin of the loop, as is known in the art.

The output of the digital compensation filter 224 is applied to summing junction 225. DPWM quantization error signal p(z) is also applied to summing junction 225. Summing junction 225 operates at rate $f_{clock}$, which is a higher rate than $k*f_s$, and represents a digital pulse width modulation operation which encodes the output of digital compensation filter 224 into a pulse width modulated signal u(z). The PWM signal u(z) has a frequency of $f_{PWM}$. The PWM signal u(z) is input into quantizer 226, which operates at $f_{clock}$. The quantizer 226 performs a many-to-few mapping, as is known in the art. The output of quantizer 226 is a 1-bit PWM digital signal y(z) which corresponds to signal a at $f_{clock}$ in FIG. 1. Digital signal y(z) is also fed back through digital low pass filter 227 which performs anti aliasing filtering and samples y(z) back to $k*f_s$ (where $k*f_s<f_{clock}$) to thereby produce feedback signal w(z). Feedback signal w(z) is typically a multilevel digital signal.

Figure 3:
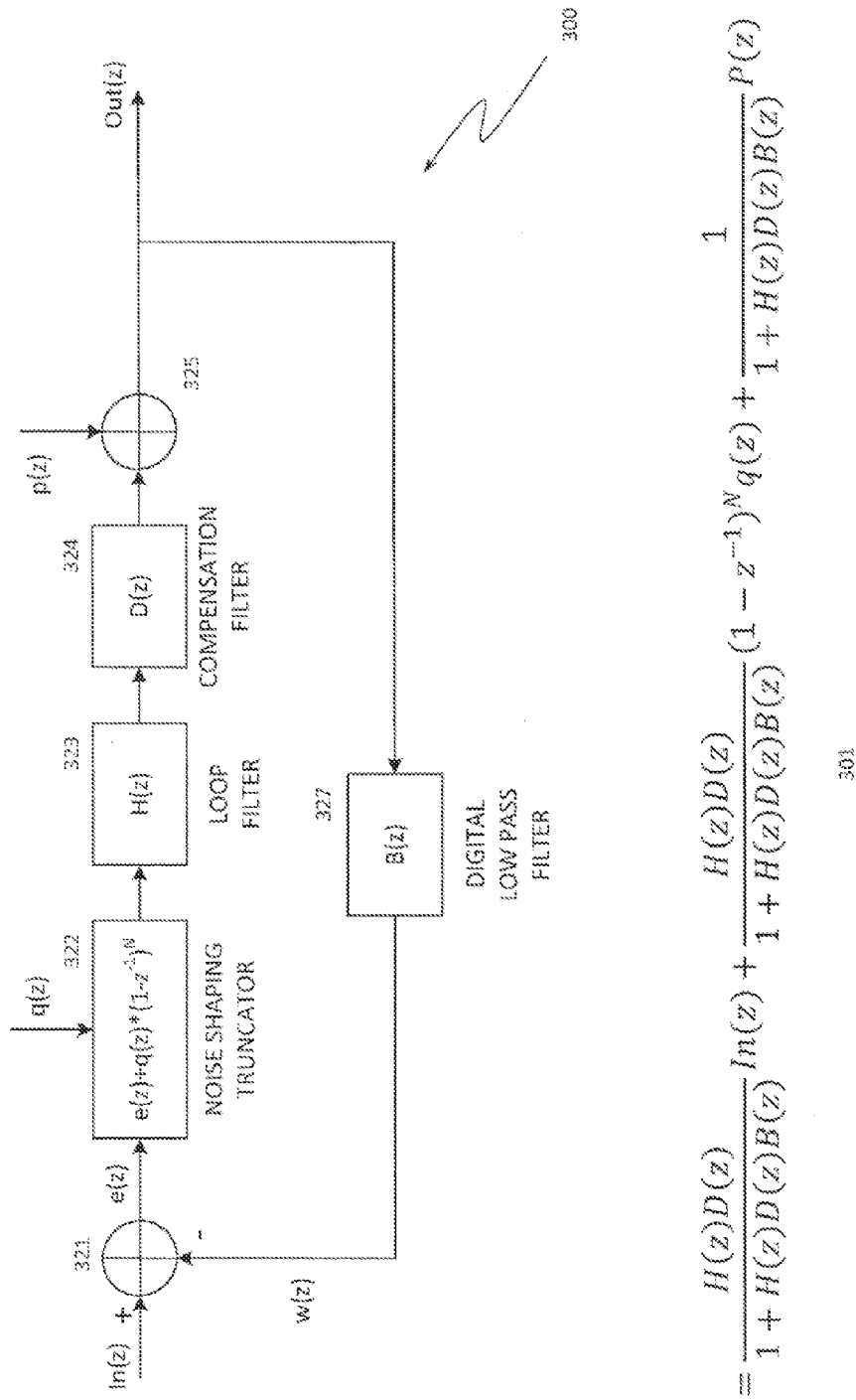
FIG. 3 is an illustration of a functional block diagram showing a loop analysis of the DPWM Noise Shaper in FIG. 2, according to an embodiment of the present subject matter.

Considering FIG. 3, functional block diagram 300, which is a z-domain linear model, is shown which illustrates a loop analysis of the DPWM Noise Shaper in FIG. 2, according to an embodiment of the present subject matter. Summing junction 321, which corresponds to summing junction 221 in FIG. 2, combines input signal In(z) and feedback signal w(z) to create error signal e(z) which is input into the noise shaping truncator 322 (which corresponds to the digital $\Delta\Sigma$ block 222 in FIG. 2). The noise shaping truncator 322 also receives digital truncation error signal q(z), as described above in FIG. 2. The noise shaping truncator 322 operates on the error signals e(z) and q(z) according to the formula:

$$e(z)+q(z)*(1-z^{-1})^N \qquad \text{(Eqn. 1)}$$

where: N is the order of the noise transfer function

The output of the noise shaping truncator 322 is input to the loop filter 323, which corresponds to the loop filter 223 in FIG. 2. In an embodiment, loop filter 323 operates on its input signal according to the formula:

$$H(z) = \frac{1}{1-z^{-1}} * G_1 \qquad \text{(Eqn. 2)}$$

where: $G_1$ is a DC gain value

The output of loop filter 323 is input to compensation filter 324, which corresponds to digital compensation filter 224 in FIG. 2. In an embodiment, compensation filter 324 operates on its input signal according to the formula:

$$D(z) = \frac{z-a}{(z-b)(z-c)} * G_2 \qquad \text{(Eqn. 3)}$$

where: $G_2$ is a DC gain value a, b, and c are constants

The values of a, b, and c are chosen so that a represents a filter zero frequency location, and b and c represent filter pole frequency locations.

The output of compensation filter 324 is input to summing junction 325, which corresponds to summing junction 225 in FIG. 2. From a linearized signal processing analysis, PWM quantization error signal p(z) is also applied to summing junction 325. The output of summing junction 325 is signal Out(z). Note that in FIG. 3 there is no block which corresponds to the quantizer 226 in FIG. 2 since the quantizer 226 does not impact the z-domain linear model represented by FIG. 3.

The output signal Out(z) is fed back through the digital low pass filter 327, which corresponds to digital low pass filter 227 in FIG. 2. In an embodiment, digital low pass filter 327 operates on its input signal, Out(z), according to the formula:

$$B(z) = \frac{1}{z-d} * G_3 \qquad \text{(Eqn. 4)}$$

where: $G_3$ is a DC gain value, and d is a filter pole location

The value of d, is chosen in such a manner that low pass filtering of undesired signal frequencies is performed according to the applicable design specifications for the circuit. As a non-limiting example, the value of d may be chosen such that signals in the audible range (e.g., up to 20 kHz) are passed and signals beyond 20 kHz are suppressed. The output of the digital low pass filter 327 is the feedback signal w(z) that is applied to the summing junction 321 as discussed above.

As is known in the art, analysis of the z-domain linear model 300 results in the following equation 301:

$$\text{Out}(z) = \frac{H(z)D(z)}{1+H(z)D(z)B(z)}\text{In}(z) + \frac{H(z)D(z)}{1+H(z)D(z)B(z)}(1-z^{-1})^N q(z) + \frac{1}{1+H(z)D(z)B(z)}p^z \qquad \text{(Eqn. 5)}$$

For the operation of the DPWM Noise Shaper 120 of FIG. 1, represented by Eqn. 5 above, the input signal should be impacted as little as possible in the band of interest. Therefore, there is a need to oversample the input signal which is accomplished by the use of the interpolation filter 110 to convert the digital input signal n at rate $f_s$ to the digital signal m at rate $k*f_s$ (which corresponds to incoming signal In(z) in FIG. 3 and Eqn. 5, above. Analyzing Eqn. 5, the term in the denominator of each of the three terms on the right-hand side of the equation, $1+H(z)D(z)B(z)$, should ideally be large to diminish error terms. However, if the denominator is too large, the loop will become unstable, as is known in the art. Typical values for the denominator term for a high fidelity system may be >100 dB, although other values are contemplated by embodiments of the present subject matter.

Considering now the first term on the right-hand side of Equation 5, this term represents the incoming signal In(z) and therefore is in the band of interest. Ideally, the response of the z-domain linear model 300 to this term is flat. In order to accomplish this, the value of $$\frac{1}{B(z)}$$

should be approximately unity gain, i.e., should act as a low pass filter in the band of interest. Considering now the second and third terms on the right-hand side of Equation 5, these terms represent error signals q(z) and p(z), respectively, and ideally the z-domain linear model 300 will suppress these terms in the band of interest and will shape the power of the error signals q(z) and p(z) such that the power of these signals will appear out of the band of interest. In the second term, the expression $(1-z^{-1})^N$ is a differentiator which acts like a high pass filter: it will attenuate low frequencies but will allow high frequencies to pass. In this manner, the frequency spectrum of incoming signals are modified such that low frequency signals are suppressed and moved to higher out-of-band frequency regions. Thus, the values in Equation 5 (i.e., G1, G2, G3, a, b, c, and d) are chosen such that for the specific circuitry in which the DPWM Noise Shaper 120 is used, the filters H(z), D(z), and B(z) in the z-domain linear model 300 operate as described above, i.e., for the suppression of noise in the band of interest.

The above-described apparatus is designed to suppress both truncation errors and DPWM quantization errors by spectrally shaping most of the power associated with these errors out of the band of interest by employing feedback. Additionally, the z-domain linear model 300 shown in FIG. 3 can be easily compensated by the included digital filter D(z) and the loop dynamic response can also be optimized by the digital filter D(z).

Figure 4:
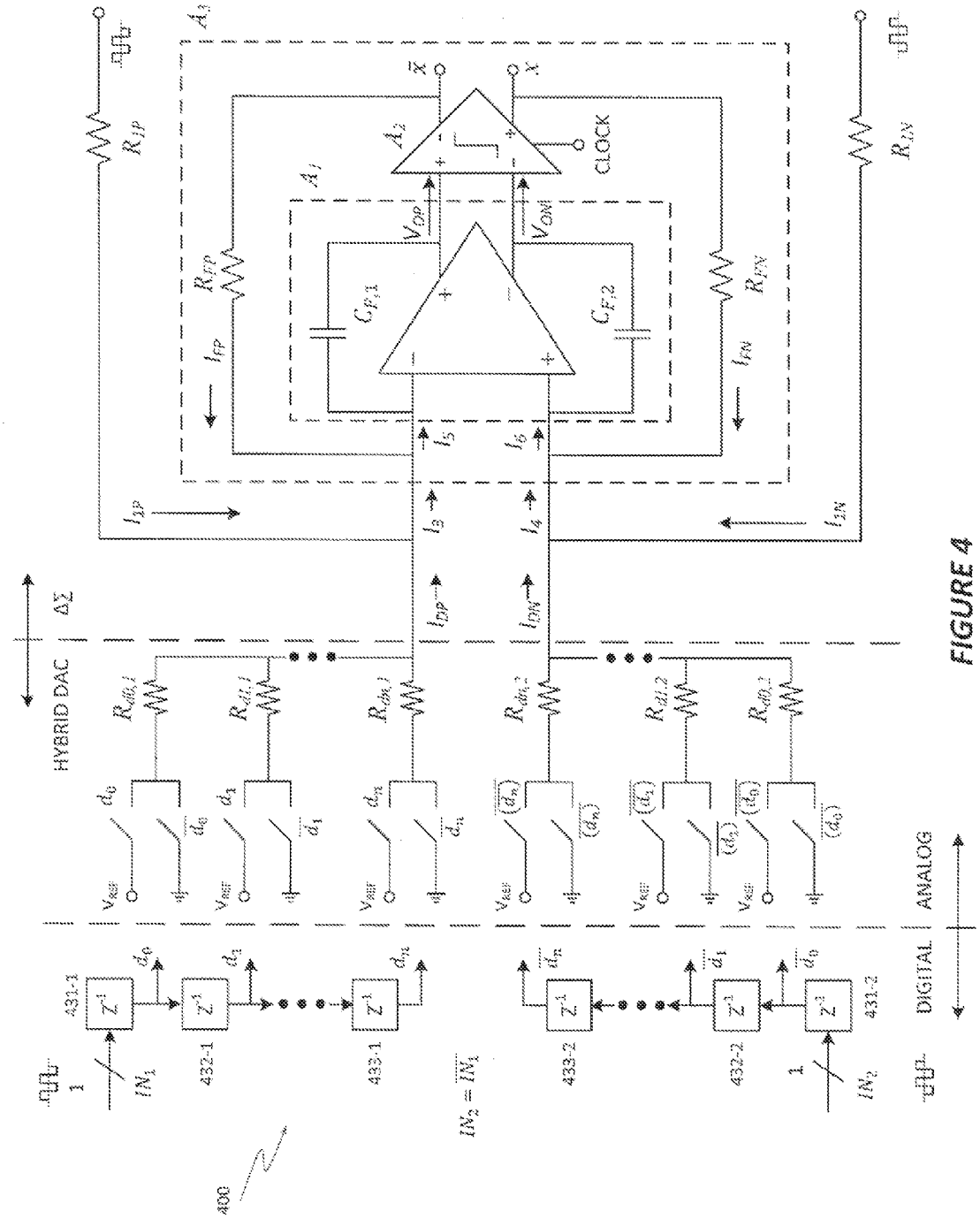
FIG. 4 is an illustration of a functional schematic diagram for the Finite Impulse Response ("FIR") digital-to-analog converter ("DAC") block and analog input Class D amplifier block in FIG. 1, according to an embodiment of the present subject matter.

FIG. 4 is an illustration of a functional schematic diagram 400 for the merged front end of the FIR DAC and analog input Class D amplifier which corresponds to block 130 and a portion of block 140 in FIG. 1, according to an embodiment of the present subject matter. In FIG. 4, the input signal IN₁ is the noise shaper 120 output signal a, which is a 1-bit PWM digital signal at $f_{clock}$, as shown in FIG. 1. The input signal IN₁ is inverted, by any known method, to produce signal IN₂ which is also a 1-bit PWM digital signal at $f_{clock}$. In FIG. 4, the FIR DAC portion of schematic diagram 400 in this embodiment is an N-tap FIR filter where the filter coefficients are analog while the delay elements 431-1, 432-1, through 433-1 and 431-2, 432-2, through 433-2 are implemented digitally using shift registers. The filter coefficients in FIG. 4 are implemented by current flowing through resistors $R_{d0,1}$, $R_{d1,1}$, through $R_{dn,1}$ and $R_{d0,2}$, $R_{d1,2}$, through $R_{dn,2}$, respectively, as described below. Other implementations for the FIR DAC in schematic diagram 400 are contemplated by the present subject matter, for example in a continuous time manner or a discrete time manner, as is known in the art.

In operation, each output of the shift registers controls a set of switches for the associated filter coefficient resistor. For shift register 431-1, the output signal $d_o$ operates the switches at the input for resistor $R_{d0,1}$, i.e., the switches designated $d_0$ and $\overline{d_0}$. If signal $d_0$ is high, the switch $d_0$ is closed thereby connecting resistor $R_{d0,1}$ to $V_{REF}$. If signal $d_0$ is low, the switch $\overline{d_0}$ is closed thereby connecting resistor $R_{d0,1}$ to ground. Similarly, for shift register 432-1, the output signal $d_1$ operates the switches at the input for resistor $R_{d1,1}$, i.e., the switches designated $d_1$ and $\overline{d_1}$. If signal $d_1$ is high, the switch $d_1$ is closed thereby connecting resistor $R_{d1,1}$ to $V_{REF}$. If signal $d_1$ is low, the switch $\overline{d_1}$ is closed thereby connecting resistor $R_{d1,1}$ to ground. Each of the remaining shift registers, up through 433-1, operate in a similar manner. The resulting output from resistors $R_{d0,1}$, $R_{d1,1}$, through $R_{dn,1}$, designated $I_{DP}$, is applied to the amplifier block $A_3$ as discussed below.

Likewise, the shift registers receiving the IN₂ signal (which is the inverse of IN₁) operate in a similar manner. For shift register 431-2, the output signal $\overline{d_0}$ operates the switches at the input for resistor $R_{d0,2}$, i.e., the switches designated $\overline{(d_0)}$ and $\overline{(\overline{d_0})}$. If signal $\overline{d_0}$ is high, the switch $\overline{(d_0)}$ is closed thereby connecting resistor $R_{d0,2}$ to ground. If signal $\overline{d_0}$ is low, the switch $\overline{(\overline{d_0})}$ is closed thereby connecting resistor $R_{d0,2}$ to $V_{REF}$. Similarly, for shift register 432-2, the output signal $\overline{d_1}$ operates the switches at the input for resistor $R_{d1,2}$, i.e., the switches designated $\overline{(d_1)}$ and $\overline{(\overline{d_1})}$. If signal $\overline{d_1}$ is high, the switch $\overline{(d_1)}$ is closed thereby connecting resistor $R_{d1,2}$ to ground. If signal $\overline{d_1}$ is low, the switch $\overline{(\overline{d_1})}$ is closed thereby connecting resistor $R_{d1,2}$ to $V_{REF}$. Each of the remaining shift registers, up through 433-2, operate in a similar manner. The resulting output from resistors $R_{d0,2}$, $R_{d1,2}$, through $R_{dn,2}$, designated $I_{DN}$, is applied to the amplifier block $A_3$ as discussed below.

The transfer function for the FIR DAC in schematic diagram 400 is:

$$H(z) = \frac{Y(z)}{X(z)} \quad \text{(Eqn. 6)}$$

$$= \sum_{i=1}^{n} \frac{R_F}{R_{di}} z^{-1}$$

As can be seen from FIG. 4, the FIR DAC in schematic diagram 400 converts the single-bit serial input signals IN₁ and IN₂ into a multi-level continuous-time output signals $I_{DP}$ and $I_{DN}$, respectively. One of the advantages of the above-described apparatus is that the FIR DAC is inherently linear since the digital implementation of the delay elements 431-1, 432-1, through 433-1, and 431-2, 432-2, through 433-2 is linear and any mismatch among the analog coefficient elements $R_{d0,1}$, $R_{d1,1}$, through $R_{dn,1}$ and $R_{d0,2}$, $R_{d1,2}$, through $R_{dn,2}$, (implemented as either current sources or, as shown in schematic diagram 400, as resistors) simply degrade the gain stop-band response and phase response. A further advantage of the FIR DAC is that since the input signals IN₁ and IN₂ are each a PWM signal, the FIR DAC is resistant to inter-symbol interference ("ISI").

A still further advantage is that the FIR DAC in schematic diagram 400 is controlled by delayed versions of the same input signals, signals IN₁ and IN₂. Since signals IN₁ and IN₂ are each only a 1-bit signal, there are no harmonic distortion errors injected due to a multi-bit input signal. For example, if the input signals IN₁ and IN₂ were to be multi-bit PCM (pulse code modulation) signals which, for example, has 8-bit words in parallel, an error in any one of those bits will produce a distortion of the input signal. In a FIR DAC having a PCM input signal, the control signals are comprised of different bit positions of the PCM signal and thus comprise harmonics of the sinusoidal input. Errors thus introduced will cause harmonic distortion which will negatively affect the linearity of the FIR DAC. In order to combat the harmonic distortion errors, a FIR DAC having a PCM (or other multi-bit) input signal will require linearization circuitry, such as Dynamic Element Matching ("DEM") in order to achieve a sufficient level of linearity.

The ΔΣ portion of the schematic diagram 400 receives the output signals $I_{DP}$ and $I_{DN}$ from the FIR DAC portion of the schematic diagram 400. The signals $I_{DP}$ and $I_{DN}$ are combined with feedback signals $I_{1P}$ and $I_{1N}$, respectively, to form signals $I_3$ and $I_4$, respectively. Feedback signals $I_{1P}$ and $I_{1N}$ are multilevel analog signals. Feedback signal $I_{1P}$ is output from power transistor 531 in FIG. 5. Feedback signal $I_{1N}$ is output from power transistor 532 in FIG. 5.

Signals $I_3$ and $I_4$ are, individually, combined with amplifier feedback signal $I_{FP}$ and $I_{FN}$, respectively, as shown in FIG. 4, thereby forming signals $I_5$ and $I_6$, respectively. Signals $I_{FP}$ and $I_{FN}$ are produced at the output of the comparator $A_2$, i.e., output decision signals $\overline{x}$ and x, respectively. Signals $I_5$ and $I_6$ are applied to the integrator $A_1$ and after operation by the integrator, signals $V_{OP}$ and $V_{ON}$, which are voltage signals, are output. Signals $V_{OP}$ and $V_{ON}$ are input to the comparator $A_2$ which compares signals $V_{OP}$ and $V_{ON}$ and produces therefrom the output decision signals x and $\bar{x}$.

Figure 5:
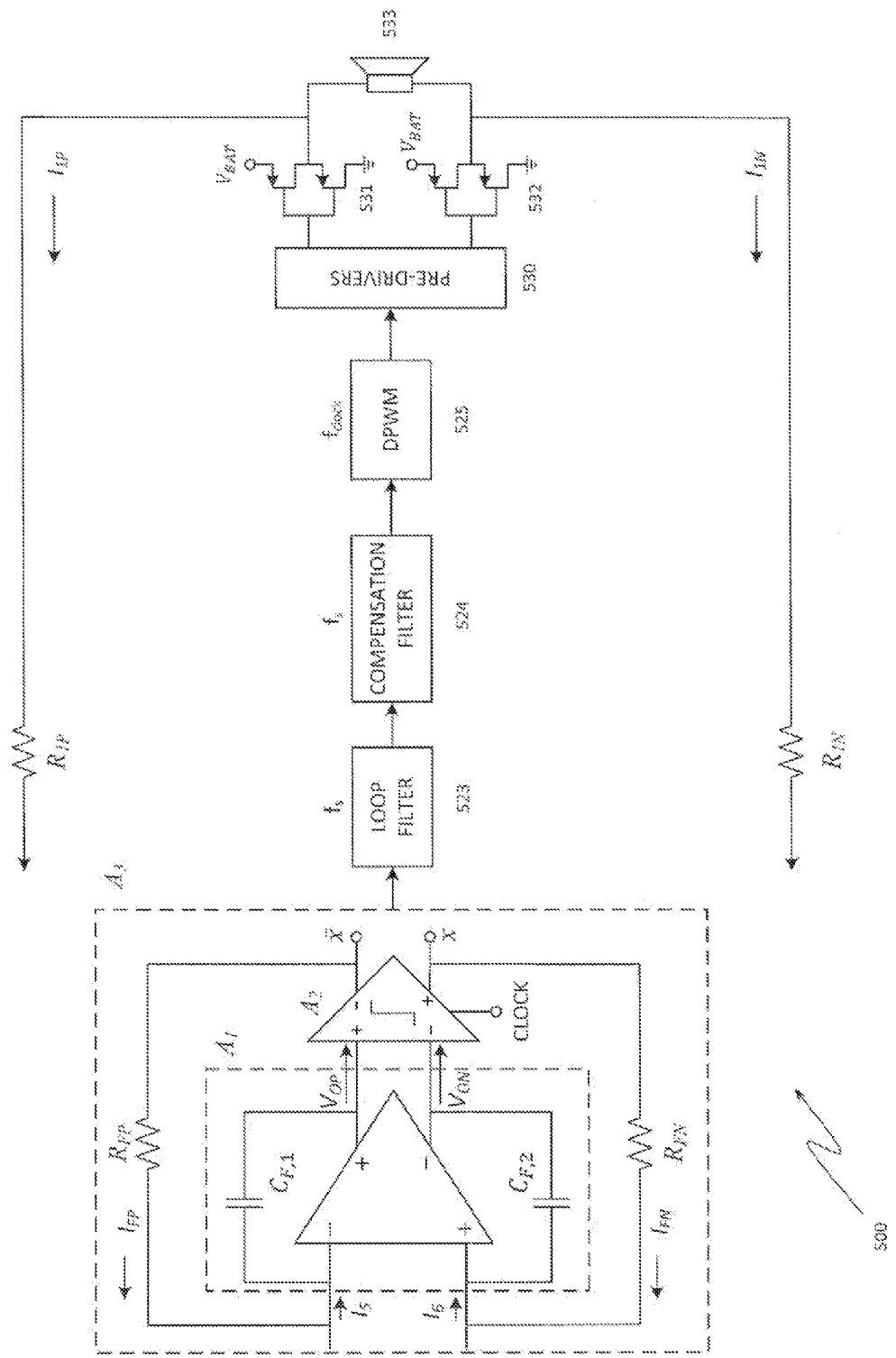
FIG. 5 is an illustration of a functional schematic diagram for the FIR DAC block combined with the analog input Class D amplifier in FIG. 1, according to an embodiment of the present subject matter.

Regarding FIG. 5, a functional schematic diagram 500 is presented which, in the particular embodiment illustrated, combines the FIR DAC in schematic diagram 400 in FIG. 4 implemented with switched resistors for the analog coefficients with the analog input Class D amplifier 140 in FIG. 1. Those of skill in the art will readily understand that FIG. 5 is simply one implementation and other implementations are equally contemplated by the present subject matter.

In FIG. 5, the amplifier block $A_3$ is the same as shown in FIG. 4. The output of amplifier block $A_3$ is applied to the loop filter 523, the output of which is applied to the compensation filter 524, the output of which is applied to the Digital Pulse Width Modulator ("DPWM") block 525. The loop filter 523 is different from, but operates in a similar manner as, the loop filter 223 in FIG. 2. Likewise, the compensation filter 524 is different from, but operates in a similar manner as, the compensation filter 224 in FIG. 2. The Digital Pulse Width Modulator block 525 is different from, but operates in a similar manner as, the summing junction 225 in FIG. 2 (as one of ordinary skill in the art will readily understand, FIG. 2 depicts signal processing circuitry while FIG. 5 depicts circuitry using a block diagram representation). The output of the DPWM block 525 is applied, in this particular embodiment, to pre-drivers 530. The outputs of the pre-drivers 530 are applied to power transistors 531 and 532, as shown. The outputs of the power transistors are applied, as is known in the art, to output device 533 which, in this particular embodiment, is an audio speaker.

The outputs of the power transistors 531 and 532 are also fed back as feedback signals $I_{1P}$ and $I_{1N}$, respectively, to resistors $R_{1P}$ and $R_{1N}$, respectively. Feedback signals $I_{1P}$ and $I_{1N}$ are two-level analog signals as mentioned above with respect to FIG. 4.

Figure 6:
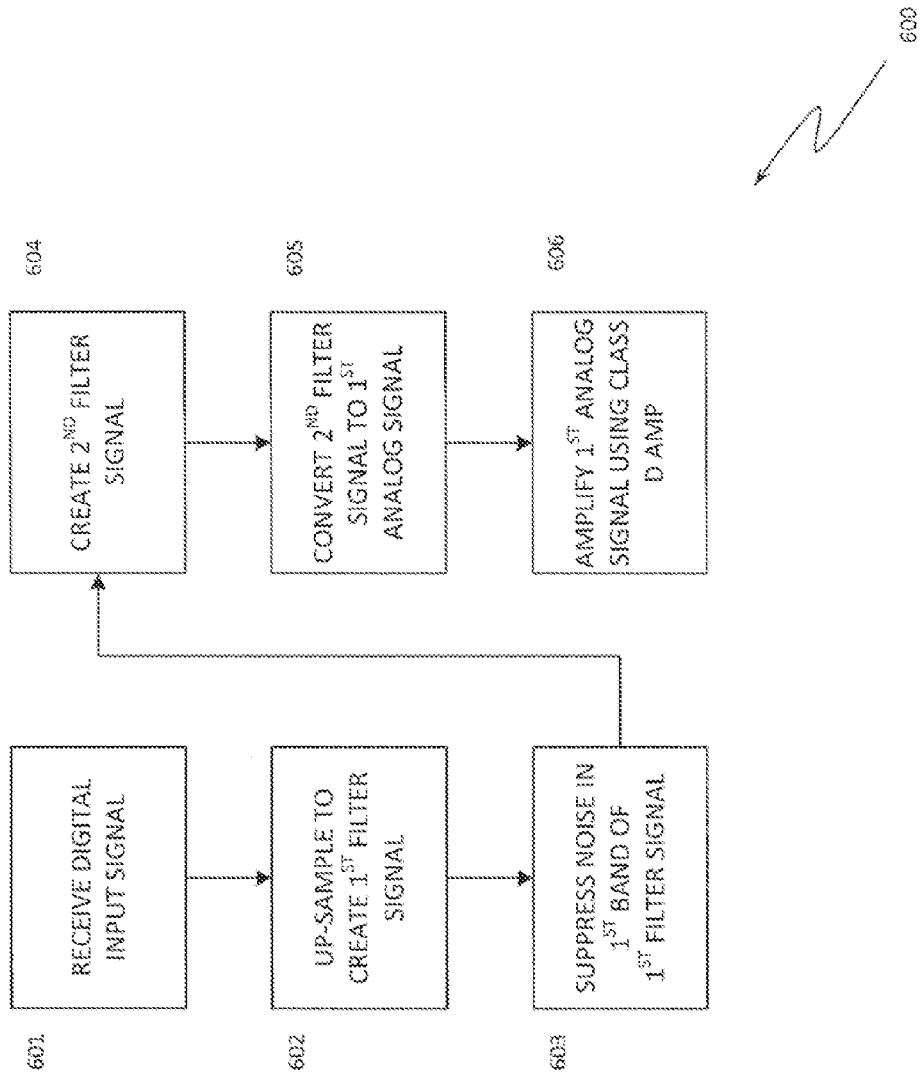
FIG. 6 is a flow chart for a method for receiving a digital input signal, converting the digital input signal to an analog signal, and amplifying the analog signal in a Class D amplifier according to an embodiment of the present subject matter.

With attention now drawn to FIG. 6, a flow chart 600 is presented for a method for receiving a digital input signal, converting the digital input signal to an analog signal, and amplifying the analog signal in a Class D amplifier according to an embodiment of the present subject matter. At block 601, a digital input signal is received. At block 602, the digital input signal is up-sampled to create a first filter signal, which is a digital signal. At block 603, noise in a first band of the first filter signal is suppressed. This noise is digital truncation error noise and/or quantization error noise. At block 604, a second filter signal, which is a digital signal, is created from the noise-suppressed first filter signal. At block 605, the second filter signal is converted to an analog signal. At block 606, the analog signal is amplified using a Class D amplifier.

Figure 7:
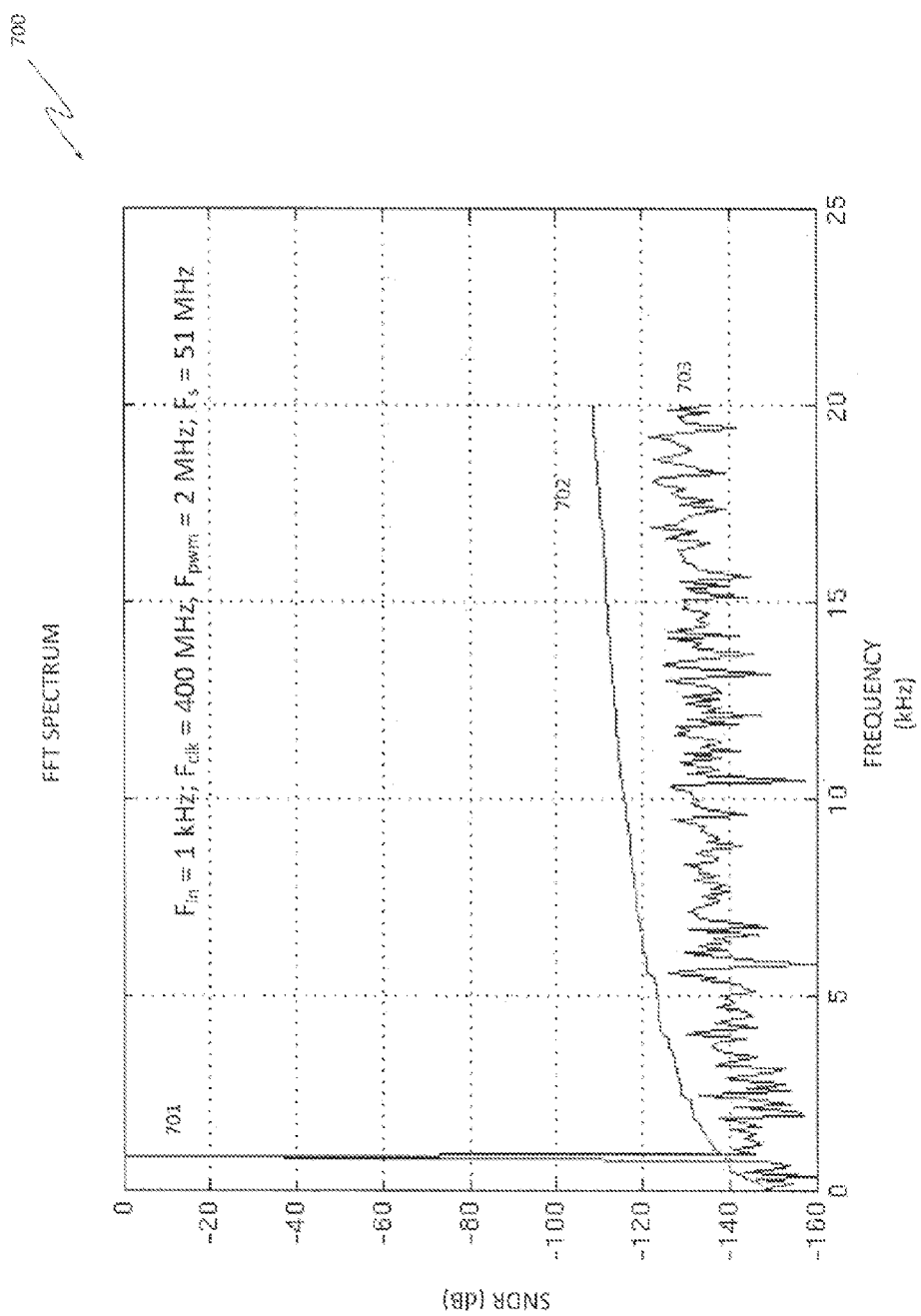
FIG. 7 is an illustration of an input/output spectrum for a digital input Class D amplifier according to an embodiment of the present subject matter.

FIG. 7 is an illustration 700 of a simulated input/output spectrum for a digital-to-analog converter according to an embodiment of the present subject matter. As seen in FIG. 7, the input frequency=1 kHz, $f_{clock}$=400 MHz, $f_{PWM}$=2 MHz, and $f_s$=51 MHz. The output spectrum spans the frequency range of 20 Hz to 20 kHz, which is the audio band. Graphed data 703 is the output spectrum showing the input signal as the peak 701. The graphed line 702 shows the growth of the output noise signal. As can been readily seen from FIG. 7, the output noise signal is well below the input signal (by more than 100 dB SNR) and the output noise signal is shaped so that it increases with increasing frequency away from the input signal.

Figure 8:
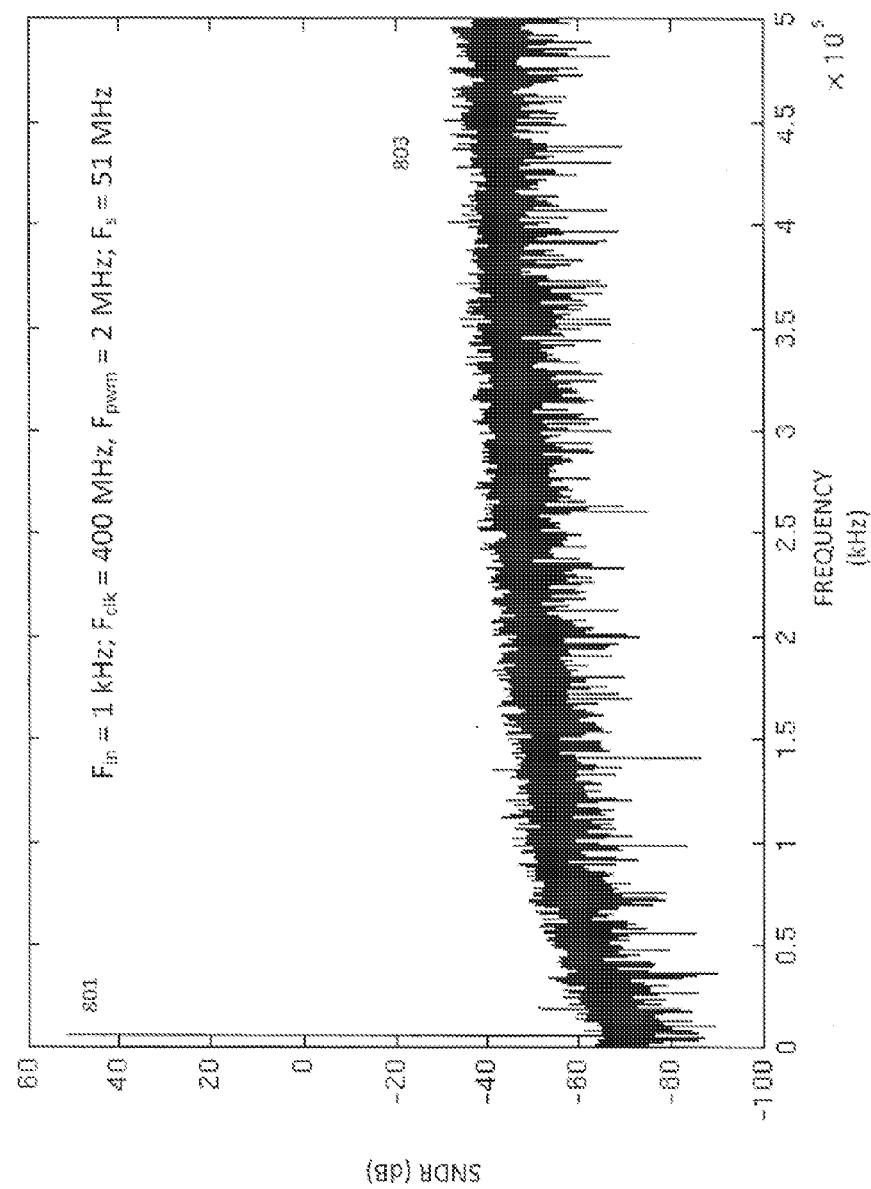
FIG. 8 is an illustration of an input/output spectrum across a wider frequency range for a digital input Class D amplifier according to an embodiment of the present subject matter.

FIG. 8 is an illustration 800 of a simulated input/output spectrum for a digital-to-analog converter according to an embodiment of the present subject matter. As seen in FIG. 8, the input frequency=1 kHz, $f_{clock}$=400 MHz, $f_{PWM}$=2 MHz, and $f_s$=51 MHz, which is the same as for FIG. 7. The output spectrum spans the frequency range of 20 Hz to 500 kHz, which is broader than that shown in FIG. 7. Graphed data 803 is the output spectrum showing the input signal as the peak 801. Similar to FIG. 7, FIG. 8 shows the output noise signal is well below the input signal and the output noise signal is shaped so that it increases with increasing frequency away from the input signal and out of the band of interest.

As discussed above, an embodiment of the present subject matter includes a system for converting a digital signal to an amplified analog signal where the system includes an interpolation filter having an input for receiving a digital input signal, a pulse width modulated noise shaper filter, and a hybrid digital to analog converter having a finite impulse response filter, an integrator, and an output for outputting an analog signal.

A further embodiment of the present subject matter includes a system for converting a digital signal to an analog signal where the system includes an interpolation filter having an input for receiving a digital signal and an output for outputting an interpolation signal. The digital signal spans a first predetermined band, and the interpolation signal spans a second predetermined band which is wider than the first predetermined band and includes the first predetermined band. The system further includes a noise shaper filter having an input for receiving the interpolation signal, a first circuit for suppressing errors in the first predetermined band of the interpolation signal; and an output for outputting a pulse width modulation ("PWM") signal, where the PWM signal is a one-bit code signal. The system also includes a digital to analog converter having an input for receiving the PWM signal, a second circuit for converting the PWM signal into a converted signal where the converted signal is a multi-level parallel signal. Still further, the system includes an output for outputting the converted signal and a reconstruction amplifier having an input for receiving the converted signal, a third circuit for changing the converted signal into an analog signal, and an output for outputting an analog signal.

According to an embodiment of the present subject matter, a method is described for converting a digital signal to an amplified analog signal. The method includes the steps of receiving a digital input signal which spans a first predetermined band, up-sampling the digital input signal to create a first filter signal which spans a second predetermined band which includes the first predetermined band and is wider than the first predetermined band, suppressing noise in the first predetermined band of the first filter signal, creating a second filter signal from the noise-suppressed first filter signal, and converting the second filter signal to an analog signal using a finite impulse response filter and an integrator.

Certain embodiments of the present subject matter include a PWM DAC system to convert digital signals into amplified analog signals containing one or more of the following features: an interpolation filter configured to up-sample an input digital signal; a digital DPWM noise shaping modulator to suppress in-band quantization errors due to digital PWM truncation errors; a FIR DAC to convert a 1-bit digital PWM signal into an analog signal without the complexity and problems associated with DEM and/or ISI; and an analog input Class D amplifier merged to the FIR DAC output to generate an amplified output analog signal.

While some embodiments of the present subject matter have been described, it is to be understood that the embodiments described are illustrative only and that the scope of the invention is to be defined solely by the appended claims when accorded a full range of equivalence, many variations and modifications naturally occurring to those of skill in the art from a perusal hereof.

We claim:

1. A system for amplifying a digital input signal to produce an analog output signal, comprising:
    an interpolation filter including an input for receiving said digital input signal;
    a digital pulse-width modulation ("DPWM") noise shaper coupled to an output of the interpolation filter;

a digital to analog converter coupled to an output of the DPWM noise shaper, the digital to analog converter comprising a finite impulse response filter, an integrator, and a comparator; and an analog-input Class D amplifier including an output for outputting an analog signal.

2. The system of claim 1 wherein said digital input signal spans a first predetermined band, and wherein said interpolation filter up-samples said digital input signal by a predetermined value and outputs the first filter signal which spans a second predetermined band which includes said first predetermined band and is wider than said first predetermined band.

3. The system of claim 2 wherein said DPWM noise shaper receives said first filter signal, suppresses noise in said first predetermined band, and outputs a DPWM signal wherein said DPWM signal spans said second predetermined band.

4. The system of claim 3 wherein said digital to analog converter receives said DPWM signal and outputs a converted signal.

5. The system of claim 4 wherein said analog-input Class D amplifier receives said converted signal and outputs said analog signal to an audio speaker which produces an audio output.

6. The system of claim 2 wherein said predetermined value is in the range of 32-2048.

7. The system of claim 1 wherein said digital input signal is a pulse code modulation signal.

8. The system of claim 1 wherein said digital input signal is a digital audio signal.

9. A system for amplifying a digital input signal to produce an analog output signal, comprising:

an interpolation filter comprising an input for receiving said digital signal and an output for outputting an interpolation signal, wherein said digital signal spans a first predetermined band, and wherein said interpolation signal spans a second predetermined band which is wider than said first predetermined band and includes said first predetermined band;

a noise shaper comprising:
  an input for receiving said interpolation signal;
  a first circuit for suppressing errors in said first predetermined band of said interpolation signal; and
  an output for outputting a pulse width modulation ("PWM") signal, wherein said PWM signal is a one-bit code signal;

a digital to analog converter comprising:
  an input for receiving said PWM signal;
  a finite impulse response filter having N-taps and N tap weights for converting said PWM signal into a converted signal wherein said converted signal is a multi-level parallel signal, wherein N is a predetermined number, and wherein each of said N-taps is implemented digitally and each of said N tap weights is implemented non-digitally using resistors;
  a third circuit for changing said converted signal into a first analog signal; and
  an output for outputting said first analog signal; and an analog-input Class D amplifier comprising an input for receiving said first analog signal and an output for outputting an analog output signal.

10. The system of claim 9 wherein said digital input signal is a pulse code modulation signal.

11. The system of claim 9 wherein said first circuit includes a noise shaping truncator, a loop filter, a compensation filter, and a digital low pass filter.

12. The system of claim 9 wherein said errors comprise quantization errors and truncation errors.

13. The system of claim 9 wherein said third circuit includes an integrator and a comparator.

14. The system of claim 13 wherein said finite impulse response filter and said third circuit operate in combination to produce a transfer function H (z) in the form of:

$$H(z) = \frac{Y(z)}{X(z)}$$

$$= \sum_{i=1}^{n} \frac{R_F}{R_{Di}} z^{-1}$$

where:
Y(z) is said analog signal;
X(z) is said PWM signal;
$R_F$ is a predetermined analog coefficient;
$R_{Di}$ are each a predetermined analog coefficient;
$z^{-1}$ is a predetermined delay element implemented digitally; and
n is a predetermined number.

15. A method for amplifying a digital input signal to produce an analog output signal, the method comprising the steps of:

receiving a digital input signal which spans a first predetermined band;

up-sampling the digital input signal to create a first filter signal which spans a second predetermined band which includes the first predetermined band and is wider than the first predetermined band;

suppressing noise in the first predetermined band of the first filter signal to provide a noise-suppressed first filter signal;

creating a digital pulse width modulation ("DPWM") signal from the noise-suppressed first filter signal;

converting the DPWM signal to a first analog signal using a finite impulse response filter and an integrator; and amplifying the first analog signal using a Class D amplifier, wherein the finite impulse response filter has N-taps and N tap weights wherein N is a predetermined number, and wherein each of said N-taps is implemented digitally and each of said N tap weights is implemented non-digitally using resistors.

16. The method of claim 15 wherein said DPWM signal is a one-bit code signal.

17. The method of claim 15 wherein the converting step includes producing a transfer function H(z) in the form of:

$$H(z) = \frac{Y(z)}{X(z)}$$

$$= \sum_{i=1}^{n} \frac{R_F}{R_{Di}} z^{-1}$$

where:
Y(z) is said analog signal;
X(z) is said DPWM signal;
$R_F$ is a predetermined analog coefficient;
$R_{Di}$ are each a predetermined analog coefficient;
$z^{-1}$ is a predetermined delay element implemented digitally; and
n is a predetermined number.

18. The method of claim 15 wherein the digital input signal is a pulse code modulation signal.

19. The method of claim 15 wherein said digital input signal is a pulse code modulation signal.

20. The method of claim 15 wherein said digital input signal is a digital audio signal.

* * * * *